United States Patent [19]

Janai et al.

[11] Patent Number: 5,329,152
[45] Date of Patent: Jul. 12, 1994

[54] ABLATIVE ETCH RESISTANT COATING FOR LASER PERSONALIZATION OF INTEGRATED CIRCUITS

[75] Inventors: Meir I. Janai, Zvi Orbach; both of Haifa; Alon Kapel, Givat Ela; Sharon Zehavi, Haifa, all of Israel

[73] Assignee: Quick Technologies Ltd., Haifa, Israel

[21] Appl. No.: 825,358

[22] Filed: Jan. 24, 1992

Related U.S. Application Data

[63] Continuation-in-part of Ser. No. 368,161, Jun. 16, 1989, abandoned, which is a continuation-in-part of Ser. No. 117,580, Nov. 6, 1987, abandoned.

[30] Foreign Application Priority Data

Nov. 26, 1986 [IL] Israel ......................................... 80790

[51] Int. Cl.⁵ ................................................ H01L 27/02
[52] U.S. Cl. ................................... 257/529; 257/665
[58] Field of Search ........................ 257/529, 530, 665

[56] References Cited

U.S. PATENT DOCUMENTS

| | | | |
|---|---|---|---|
| 4,177,474 | 12/1979 | Ovshinsky | 257/55 |
| 4,197,555 | 4/1980 | Uehara et al. | |
| 4,217,570 | 8/1980 | Holmes | 257/529 |
| 4,233,671 | 11/1980 | Gerzberg et al. | |
| 4,238,839 | 12/1980 | Redfern et al. | |
| 4,387,503 | 6/1983 | Aswell et al. | |
| 4,413,272 | 11/1983 | Mochizuki et al. | 257/529 |
| 4,455,495 | 6/1984 | Masuhara et al. | |
| 4,476,375 | 10/1984 | Ogawa | 219/121.72 |
| 4,476,478 | 10/1984 | Noguchi et al. | |
| 4,536,249 | 8/1985 | Rhodes | |
| 4,536,949 | 8/1985 | Takayama et al. | 257/529 |
| 4,581,628 | 4/1986 | Miyauchi et al. | |
| 4,590,589 | 5/1986 | Gerzberg | |
| 4,628,590 | 12/1986 | Udo et al. | |
| 4,636,404 | 1/1987 | Raffel et al. | |
| 4,720,908 | 1/1988 | Wills | |
| 4,740,485 | 4/1988 | Sharpe-Geisler | |
| 4,783,424 | 11/1988 | Ohno et al. | |
| 4,800,179 | 1/1989 | Mukai | |
| 4,875,971 | 10/1989 | Orbach et al. | 156/644 |
| 5,111,273 | 5/1992 | Orbach et al. | 257/529 |

FOREIGN PATENT DOCUMENTS

| | | |
|---|---|---|
| 61678 | 4/1984 | Israel . |
| 61-194740A | 8/1986 | Japan . |
| 2170649A | 8/1986 | United Kingdom . |

OTHER PUBLICATIONS

M. J. Rand et al., "Optical Absorption on a Control Test for Plasma Silicon Nitride Deposition", *Journal of the Electrochemical Society* (Jan. 1978) pp. 99–101.

D. R. Ulrich, "Sol-gel processing", *Chemtech* (Apr. 1988) pp. 242–249.

S. M. Sze, *Semiconductor Diods Physics and Technology*, John Wiley & Sons, New York (1985) p. 344.

Garrison et al, Laser Ablation of Organic Polymers, Journal of Applied Physics, No. 8, (Apr. 1985) pp. 2909–2914.

J. J. Gadia et al., IBM Disclosure Bulletin, vol. 21, No. 12, May, 1979, Selective Conversion of Films . . . .

B. C. Cole, Laser Micromachining Brings Quick Prototypes, Electronics, Nov. 12, 1987.

J. Melngailis et al. The Focused Inn Beam as an Integrated . . . J. Vac. Sci. Technol. B. vol. 4, No. 1, Jan.-/Feb. 1988.

(List continued on next page.)

*Primary Examiner*—J. Carroll
*Attorney, Agent, or Firm*—Browdy and Niemark

[57] ABSTRACT

A programmable integrated circuit for prototyping applications including a first patterned metal layer, an insulation layer formed over the first metal layer and a second patterned metal layer formed over the insulation layer, the first and second patterned metal layers being formed with selectably removable regions, the insulation layer being formed with apertures overlying at least some of the selectably removable regions, and there being formed over the selectably removable regions a coating comprising a layer of a dielectric material of high laser radiation absorption coefficient.

17 Claims, 18 Drawing Sheets

OTHER PUBLICATIONS

J. Logue, et al. Techniques for Improving Engineering Productivity . . . IBM J. Res. Develop. vol. 25 No. 3, (May 1981) pp. 107-115.

J. I. Raffel et al. Laser-formed Connections Using Polymide, Journal of Vacuum Science and Technology, B., vol. 4, No. 1, (Feb. 1986) pp. 176-180.

J. A. Yasaitis et al Low Resistance Laser Formed Lateral Links 1982 IEEE. Electron Device Letters, vol. EDL-3, No. 7, p. 184.

J. I. Raffel et al, A Demonstration of Very Large Area (1983) IEEE. Proc. Int. Symp. Circuits & Systems, pp. 781-783.

J. C. North et al, Laser Coding of Bipolar Read-Only Memories, IEEE Journal of Solid State Circuits, (Aug. 1976) pp. 500-505.

J. C. North, Laser Vaporization of Metal Films . . . J. of Applied Physics, vol. 48, No. 6, (Jun. 1977) pp. 2419-2423.

J. I. Raffel et al. A Wafer-Scale Digital Integrator . . . IEEE J. of Solid-State Circuits, vol. SC-20, No. 1 (Feb. 1985) pp. 399-406.

J. I. Raffel et al, Laser Programmed Vias for Restructurable VLSI, International Electron Devices Meeting, (Dec. 1980) pp. 132-135.

ABLATIVE ETCH RESISTANT COATING FOR LASER PERSONALIZATION OF INTEGRATED CIRCUITS

REFERENCE TO RELATED APPLICATIONS

This is a continuation-in-part of U.S. patent application Ser. No. 07/368,161, Jun. 16, 1989, abandoned, which is a continuation-in-part of U.S. patent application Ser. No. 07/117,580, Nov. 6, 1987, abandoned.

FIELD OF THE INVENTION

The present invention relates to fabrication of integrated circuits and more particularly to techniques associated with the fabrication of prototype integrated circuits.

BACKGROUND OF THE INVENTION

In the fabrication of prototype integrated circuits a metal layer is selectively removed. This removal may be effected, for example, by laser machining or chemical etching techniques. Normally a protective insulative layer, such as phosphorous-doped glass or silicon nitride or both of them, is formed over the metal layer for mechanical protection as well as electrical insulation.

SUMMARY OF THE INVENTION

In accordance with a preferred embodiment of the present invention there is provided a semiconductor device including:

a first patterned metal layer;

an insulation layer formed over the first metal layer; and a second patterned metal layer formed over the insulation layer;

the first and second patterned metal layers being formed with selectably removable regions;

the insulation layer being formed with apertures overlying at least some of the selectably removable regions;

there being formed over the selectably removable regions a triple layer coating comprising a layer of silicon oxide over which is formed a layer of silicon nitride and over which is formed a layer of amorphous silicon.

There is also provided in accordance with an embodiment of the invention an integrated circuit as described above wherein the silicon oxide layer has a thickness of between 1000 and 3000 angstrom, the silicon nitride layer has a thickness between 4000 and 8000 angstrom and the amorphous silicon layer has a thickness of between 3000 and 6000 angstrom.

Preferably the amorphous silicon layer contains up to 30% atomic weight of at least one of Hydrogen, Carbon, Nitrogen and Oxygen. It is also preferred that the silicon oxide layer contain up to 10% atomic weight of at least one of arsenic, phosphorous and boron.

Additionally in accordance with a preferred embodiment of the present invention there is provided a semiconductor device comprising:

a first patterned metal layer;

an insulation layer formed over the first metal layer; and a second patterned metal layer formed over the insulation layer;

the first and second patterned metal layers being formed with selectably removable regions, the insulation layer being formed with apertures overlying at least some of the selectably removable regions, and there being formed over the selectably removable regions a multi-layer coating comprising first and second dielectric layers having different etchability and thereover a layer of amorphous silicon.

Preferably the first dielectric layer may be a planarization layer comprising polyimide, probimide or spin-on glass, of thickness preferably between 0.5 and 2 micron.

Further in accordance with a preferred embodiment of the present invention there is provided a semiconductor device comprising:

a first patterned metal layer;

an insulation layer formed over the first metal layer; and second patterned metal layer formed over the insulation layer;

the first and second patterned metal layers being formed with selectably removable regions, the insulation layer being formed with apertures overlying at least some of the selectably removable regions, and there being formed over the selectably removable regions a multi-layer coating comprising a dielectric layer and thereover a layer of laser energy absorbing material.

Preferably the absorbing material comprises one of the groups of $As_2S_3$, pure a-Si, or a-Si alloy.

Also in accordance with an embodiment of the invention there is provided a semiconductor device comprising:

a first patterned metal layer;

an insulation layer formed over the first metal layer; and a second patterned metal layer formed over the insulation layer;

the first and second patterned metal layers being formed with selectably removable regions, the insulation layer being formed with apertures overlying at least some of the selectably removable regions, and there being formed over the selectably removable regions a coating comprising a layer of amorphous silicon.

Still further in accordance with an embodiment of the present invention there is provided a semiconductor device comprising:

a first patterned metal layer;

an insulation layer formed over the first metal layer; and a second patterned metal layer formed over the insulation layer;

the first and second patterned metal layers being formed with selectably removable regions, the insulation layer being formed with apertures overlying at least some of the selectably removable regions, and there being formed over the selectably removable regions a multi-layer coating comprising a dielectric and thereover a layer of amorphous silicon.

In accordance with one embodiment of the invention, the apertures overlie removable regions on both the first and second metal layers.

The present invention also seeks to provide a technique for fabrication of prototype integrated circuits from finished integrated circuit blanks whereby it is possible to selectively remove portions of the metal conductor at a plurality of metal layers in the finished integrated circuit blank.

There is also provided in accordance with a preferred embodiment of the present invention a technique for fabrication of prototype integrated circuits comprising the steps of:

providing at least one metal layer onto a substrate;

patterning said at least one metal layer to form a plurality of interconnected metal lines;

coating at least portions of said at least one metal layer with a metal-etch resistant layer whose etch resistance may be eliminated at selected regions by radiation directed thereto;

eliminating the etch resistance of the etch resistant layer at selected regions by applying radiation thereto; and chemically etching said at least one metal layer at locations underlying said selected regions to define the desired electrical characteristics of the integrated circuit.

Preferably, the etch resistant layer is formed of one or more materials selected from the group of $As_2S_3$, polyimide, pure amorphous silicon (a-Si) or an amorphous silicon alloy such as a-Si:H, a-$Si_xO_{1-x}$:H, a-$Si_xN_{1-x}$:H, a-$Si_xO_yN_{1-x-y}$:H, a-SiC, a-SiGe where x is greater than or equal to 0.5 and x and y are less than or equal to 1.

There is also provided in accordance with a preferred embodiment of the present invention a technique for fabrication of prototype integrated circuits comprising the steps of providing a metal layer onto a substrate, patterning said metal layer, coating the metal layer with an insulative layer and defining a multiplicity of discrete apertures in the insulative layer overlying exposed regions of the metal layer which potentially may be sought to be removed, coating at least the exposed regions with an etch resistant layer, removing the etch resistant layer of selected ones of the exposed regions and chemically etching the exposed regions to define the desired electrical characteristics of the integrated circuit.

In accordance with a preferred embodiment of the present invention, the step of insulative coating is effected by first coating the entire area and then using a mask to define the locations of multiplicity of discrete apertures which are formed by etching techniques.

Additionally in accordance with a preferred embodiment of the invention, the mask is formed to define a selected array of apertures corresponding to a predetermined metal layer removal arrangement.

In accordance with the present invention, the apertures thus formed over the metal layer at discrete locations serve to define precisely the boundaries of the fused area, when the radiation beam is of larger dimensions than the aperture or is not precisely centered thereon. Accordingly requirements for high accuracy in registration of the radiation beam may be relaxed.

Additionally in accordance with a preferred embodiment of the present invention the pattern of apertures established over the metal layer may define a pre-determined pattern for subsequent laser machining.

Further in accordance with an embodiment of the invention, etchable regions may be selectably defined by dissolving the etch resistant layer with the underlying metal by means of suitable laser radiation.

Additionally in accordance with an embodiment of the present invention, an anti-reflective coating may be formed over the etch-resistant layer in order to reduce the energy requirements of the laser radiation.

Further in accordance with an embodiment of the invention, laser radiation may be substituted by any other suitable type of radiation, including, for example, electron beam radiation and ion beam radiation.

In another preferred embodiment of the present invention, the etch resistant layer is composed of first and second layers. The first layer is preferably an electrical insulation layer preferably composed of a dielectric material such as Si-N, PSG or $SiO_2$. The second layer, which is formed over the first layer, is a laser absorbing layer formed preferably of amorphous silicon (a-Si), or an a - si alloy such as a-Si:H, a-$Si_xO_yN_{1-x-y}$:H, where x is equal to or larger than 0.5 and x+y are less than or equal to 1, a-SiC and a-SiGe.

By using a two layer etch resistant structure of the type described above, good laser energy absorption is achieved along with good etch resistance and good step coverage. Use of the two-layer structure is particularly appropriate whenever a dry etch is used following laser exposure.

When the two layer etch resistant structure of the invention is employed, personalization will preferably include the step of laser ablation of the upper laser-absorbing layer, together with some portion of the lower dielectric layer. The remaining portion of the lower dielectric layer is later removed by dry etching. An anisotropic dry etch of the exposed metal links is then performed, followed by removal of the upper dielectric and laser absorbing layers.

Unlike other radiation-sensitive etch-resistant films commonly used in the production of integrated circuits, the compositions listed above are sensitive only to laser radiation above a certain power density threshold, and have practically unlimited shelf life at normal ambient room conditions. Accordingly the above-described etch-resistant layers are ideal for prototyping applications, where finished integrated circuit blanks must be stored for a relatively long period before they are programmed.

It should be appreciated that the function of the laser-absorbing layer is not to enhance the absorption of laser radiation in the underlying layers, as is the function of some dielectric anti-reflective coatings sometimes used in the production of integrated circuits. Rather, the laser absorbing layer is intended to absorb most of the actinic radiation and ablate with minimal heat transfer to the underlying integrated circuit.

BRIEF DESCRIPTION OF THE DRAWINGS

The present invention will be understood and appreciated more fully from the following detailed description, taken in conjunction with the drawings wherein.

DETAILED DESCRIPTION OF PREFERRED EMBODIMENTS

Reference is now made to FIGS. 1–6, which illustrate a technique for manufacture of a prototype integrated circuit in accordance with a preferred embodiment of the present invention.

Figure 1:
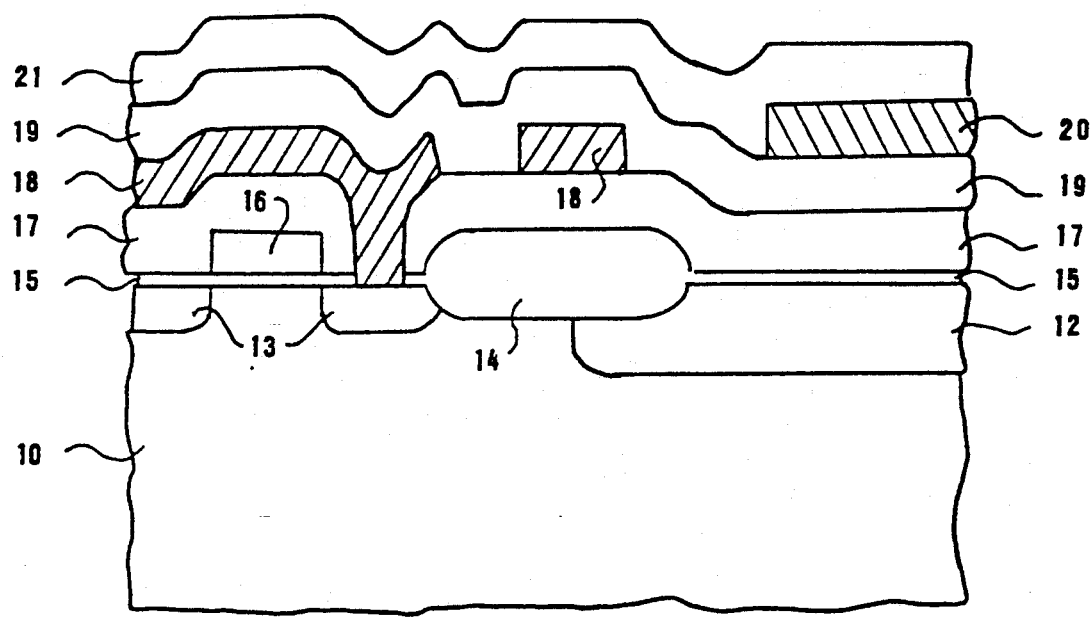
FIG. 1 is a cross-sectional illustration of a portion of a typical integrated circuit.

FIG. 1 illustrates in cross-section (not to scale) a portion of a typical integrated circuit comprising a substrate layer 10, typically formed of silicon or gallium arsenide. A plurality of ion implanted or diffusion doped layers 12 and 13 are disposed over substrate layer 10 and are covered by insulative layers 14 and 15, such as layers formed of silicon oxide, silicon nitride or polyimide. A conducting layer, such as a polysilicon gate 16, lies over layers 14 and 15. Gate 16, layer 15 and layer 14 are in turn covered by a further insulating layer 17, such as a layer formed of phosphorous-doped or undoped silicon oxide, silicon nitride or polyimide. Contact holes are formed in insulating layers 15 and 17 in order to provide electrical contact between layers 10, 12, 13 and 16 at required locations.

A patterned conducting metal layer 18, such as a layer formed of aluminum, copper, gold, titanium, molybdenum, nickel, chrome, tungsten or combinations of the above, with or without silicon, is located over layer 17 and in local communication with a portion of diffusion layer 13. A further insulating layer 19, such as a layer formed of silicon oxide, silicon nitride or polyimide, overlies layers 17 and 18. An additional patterned conducting metal layer 20 may be locally deposited over insulative layer 19. An insulative protective layer 21 overlies layers 19 and 20.

Figure 2:
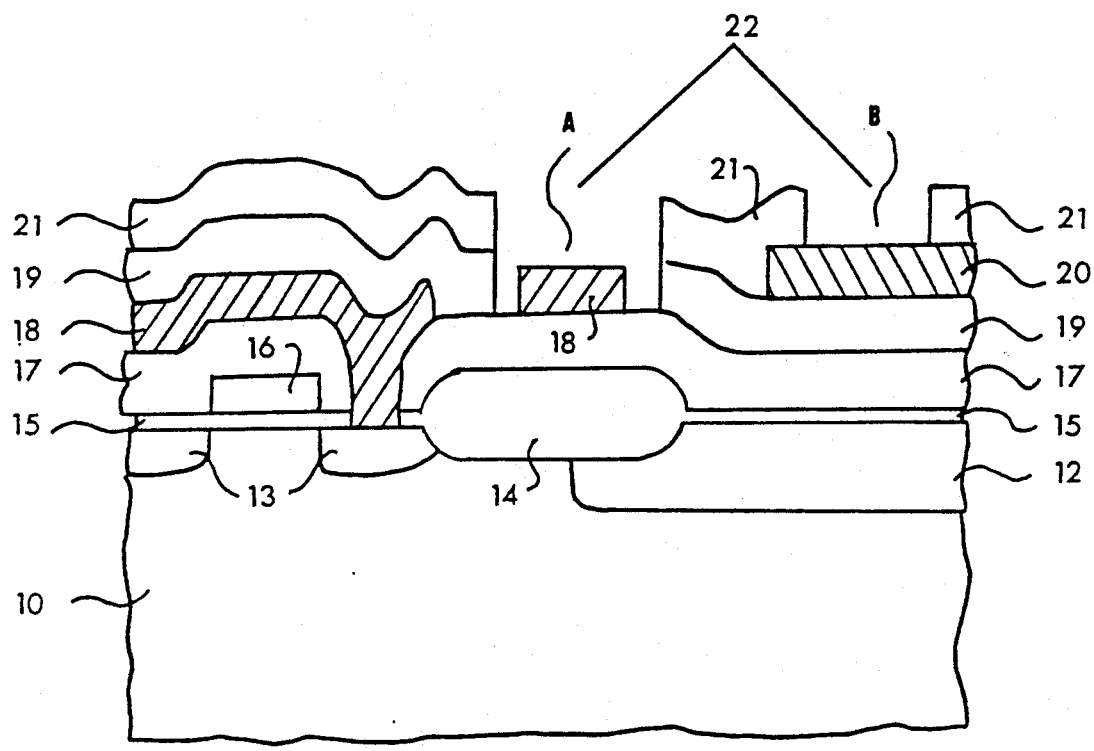
FIG. 2 is a cross-sectional illustration of a typical integrated circuit having apertures formed in insulating layers thereof.

Referring now to FIG. 2, there is seen an integrated circuit of the same configuration as that illustrated in FIG. 1, and formed in accordance with the present invention. It is seen that insulative layers 19 and 21 have been formed with discrete apertures 22, indicated by reference letters A and B, so as to expose metal layers 18 and 20 respectively. In accordance with the present invention, apertures are defined in the insulative layer or layers at all locations at which it may be desired to remove metal thereunder.

Figure 3A:
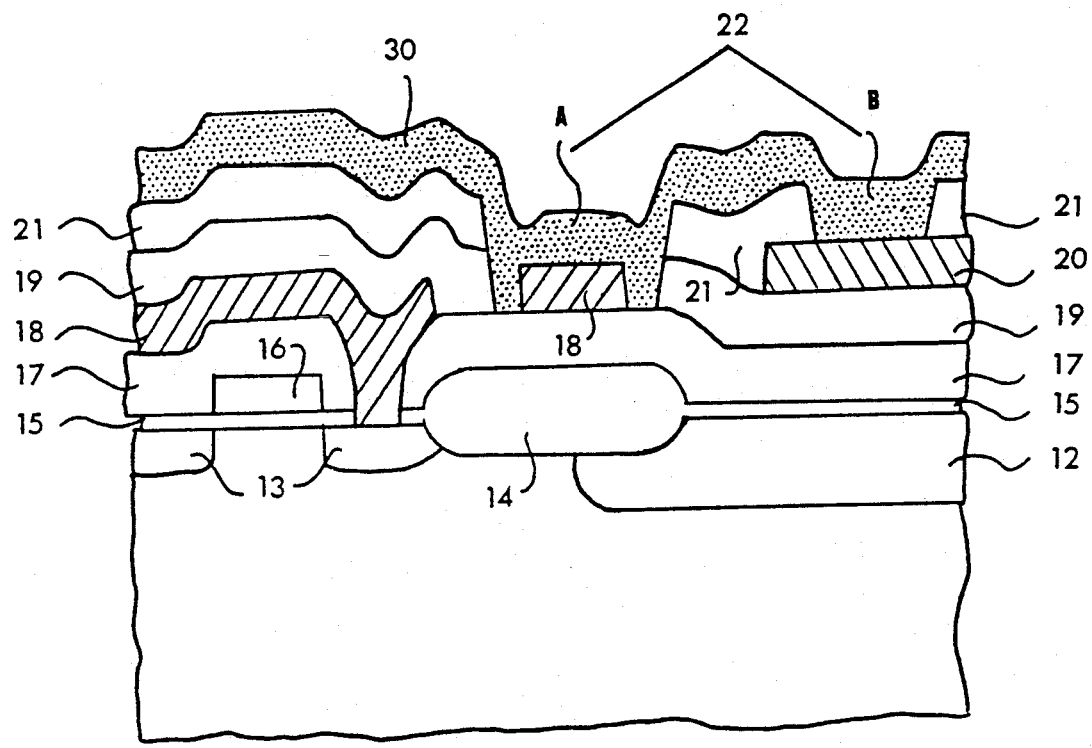
FIG. 3A is a cross-sectional illustration of a typical integrated circuit having apertures formed in insulating layers thereof and coated with a metal etch-resistant coating.

According to a preferred embodiment of the present invention, shown in FIG. 3A, the configuration shown in FIG. 2 is further coated by an etch resistant volatile layer 30, typically formed of amorphous silicon (a-Si). Layer 30 is selected so as to absorb, at room temperature, at least 10% of the energy of a pulsed laser such as a Q-switched Nd+YAG laser and is of typical thickness between 3000 Angstrom and 10,000 Angstrom.

Preferably layer 30 is a-Si deposited by sputtering or by low-pressure, plasma-enhanced chemical vapor deposition at a temperature below 250 degrees Celsius so as to provide good step coverage without damaging the properties of metal layers 18 and 20 or the contact properties of the metal to semiconductor layers 10, 12, 13 and 16.

The chemical makeup of layer 30 preferably includes at least one of the following: $As_2S_3$, nitrocellulose, polyimide, or a novolac resin with a high concentration of a laser absorbing dye, amorphous silicon (a-Si) or a-Si alloy such as a-Si:H, a-$Si_xO_{1-x}$:H, a-$Si_xN_{1-x}$:H, a-$Si_x$-$O_yN_{1-x-y}$:H, where x is greater than or equal to 0.5 and x+y are less than or equal to 1.

The a-Si layer may be phosphorous-doped or boron-doped with doping levels up to 10%. The hydrogen content may be up to 30%.

Figure 4A:
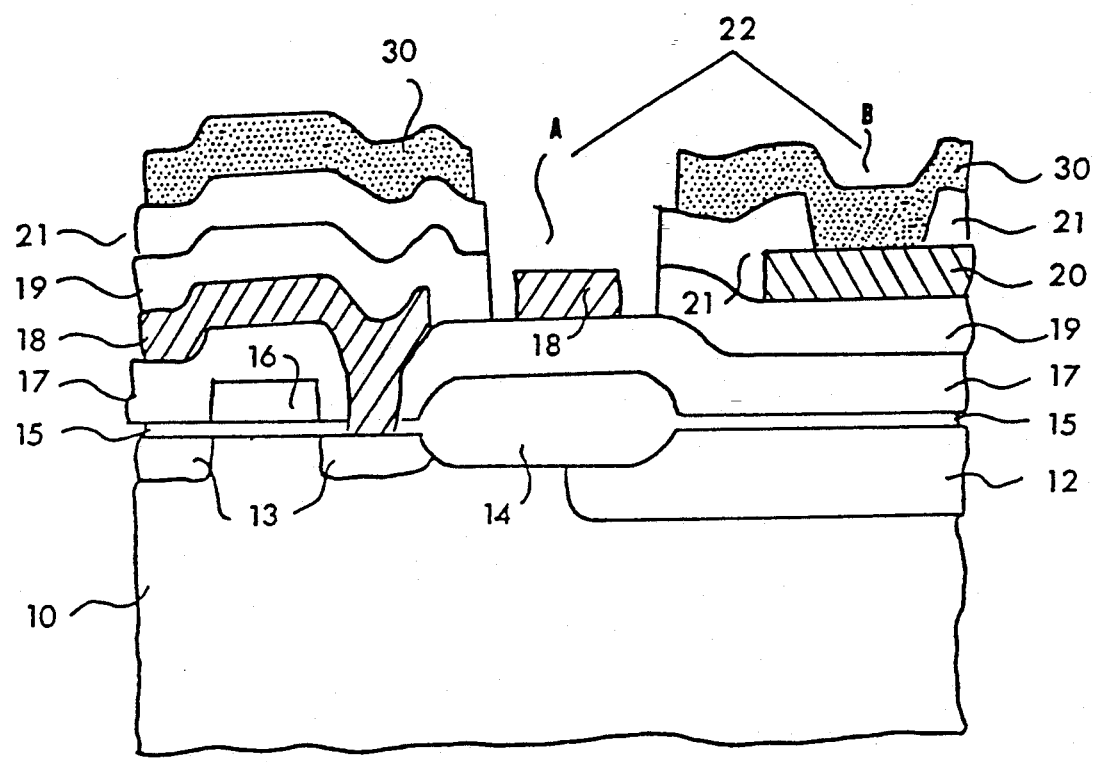
FIG. 4A is a cross-sectional illustration of the integrated circuit of FIG. 3A after laser removal of the etch-resistant coating from one of the above-selected apertures.

Referring now to FIG. 4A, it is seen that the amorphous silicon layer 30 is blown away by the application of laser energy at selected locations over apertures 22, corresponding to locations where it is desired to remove the underlying metal. The laser radiation may be provided by a Q-switched frequency doubled NdYAG laser with pulse energy typically between 0.2 J/cm$^2$ and 10 J/cm$^2$ and pulse duration 50 nsec. Alternatively, a pulsed laser diode or Excimer laser may be employed for this purpose. A typical peak power density is $5 \times 10^7$ W/cm$^2$.

Further in accordance with an embodiment of the invention, etchable regions may be selectably defined by dissolving the etch resistant layer with the underlying metal by means of suitable laser radiation. This may be achieved, for example, where layer 30 is formed of amorphous silicon and layer 18 is formed of aluminum or gold. Under laser radiation the amorphous silicon is heated and reacts with the aluminum to form microscopic metallic filaments through the amorphous silicon coating as well as microcrystalline aluminum-doped silicon grains in the aluminum layer. This causes the etch resistant layer at the selected regions to become relatively transparent to metal etchants. In this embodiment of the invention it is not necessary to use a laser with high peak power density, however, at laser pulse durations shorter than 1 microsecond with pulse energy density above 10 J/cm$^3$, part of the etch resistant layer may also be blown away. Typically the laser radiation may be provided by a concentrated frequency doubled Nd+YAG laser with pulse duration up to 0.1 second and peak power density below 10$^6$ W/cm$^2$. Alternatively an argon ion laser or a pulsed laser diode or Excimer laser may be employed for this purpose.

Additionally in accordance with an embodiment of the invention, laser radiation may be substituted by any other suitable type of radiation, including, for example, electron beam radiation and focused ion beam radiation. A suitable ion beam has 10$^{19}$ ions/cm$^2$ and an energy flux above 10 J/cm$^2$.

Figure 5A:
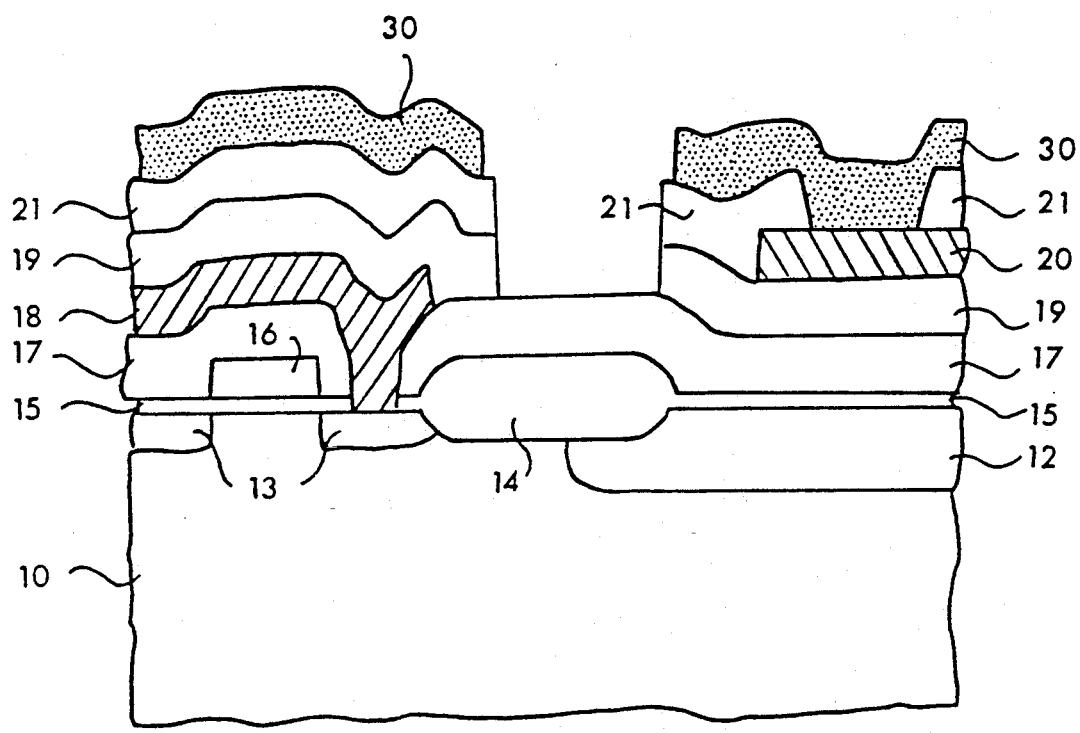
FIG. 5A is a cross-sectional illustration of the integrated circuit of FIG. 4A after chemical etching of the metal underlying the removed etch-resistant coating.

Following definition of etchable regions underlying the amorphous silicon layer 30 at the selected locations, the integrated circuit blank is subjected to etching typically by an aluminum etchant, such as nitric acid combined with phosphoric acid and acetic acid, in solution for removal of the metal underlying those of apertures 22 having the etchable regions defined thereunder. Alternatively the metal removal may be achieved by plasma containing chlorine. It is appreciated that in any case layer 30 serves to protect all of the remaining surface of the integrated circuit, including those surfaces on which apertures 22 have been defined, against etching or metal removal by any other technique. FIG. 5A illustrates the partially completed integrated circuit after the above-described selected metal removal.

Figure 6:
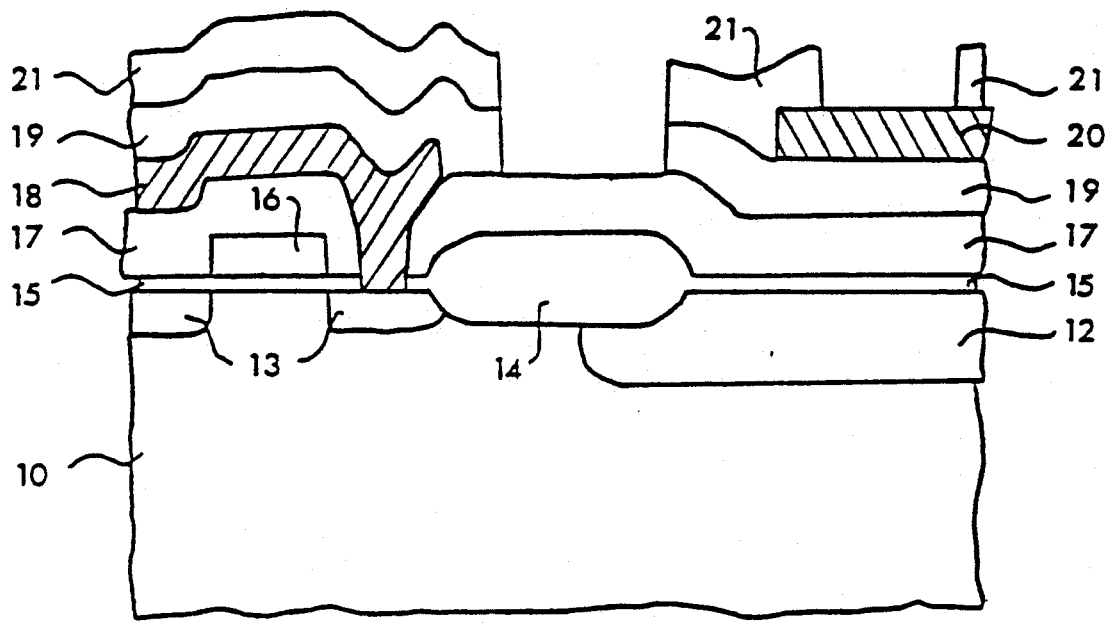

Following metal removal, the amorphous silicon layer 30 may be removed as by an amorphous silicon wet or dry etchant, such as a solution of HF:HNO$_3$:CH$_3$COOH, Hydrazene of XeF gas. This stage is illustrated in FIG. 6.

Additionally in accordance with an embodiment of the present invention, an anti-reflective coating may be formed over the etch-resistant layer in order to reduce the energy requirements of the laser radiation.

Figure 3B:
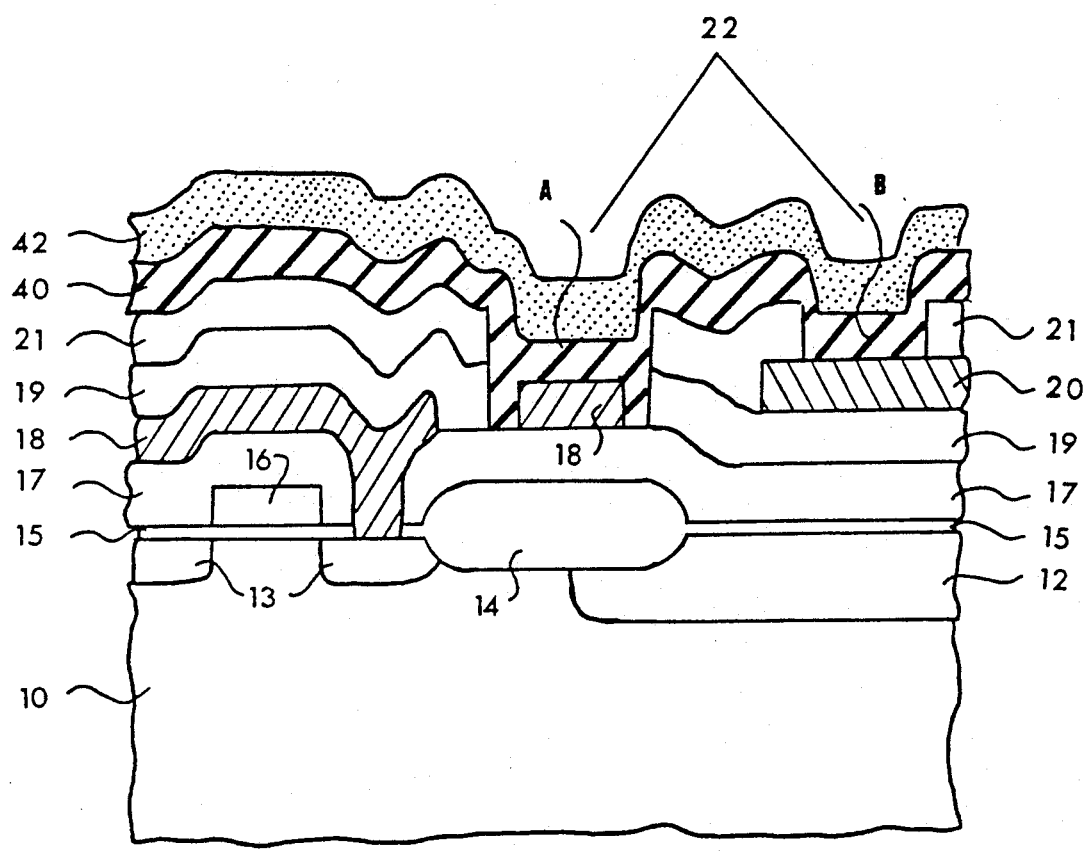
FIG. 3B is a cross-sectional illustration of the integrated circuit of FIG. 2 coated with a two layer etch-resistant coating.

Reference is now made to FIG. 3B, which is a cross-sectional illustration of the integrated circuit of FIG. 2 coated with a two layer etch-resistant coating;

According to a preferred embodiment of the present invention, the etch resistant coating includes an insulation layer, indicated by reference numeral 40, which has good resistivity to metal etchants and good step coverage and is preferably composed of a dielectric material such as Si$_3$N$_4$(silicon nitride).

Formed over layer 40 is a laser radiation absorbing layer 42, typically composed of amorphous silicon (a-Si), which absorbs laser radiation in the visible and near UV range and particularly at 5320 Angstroms.

Figure 4B:
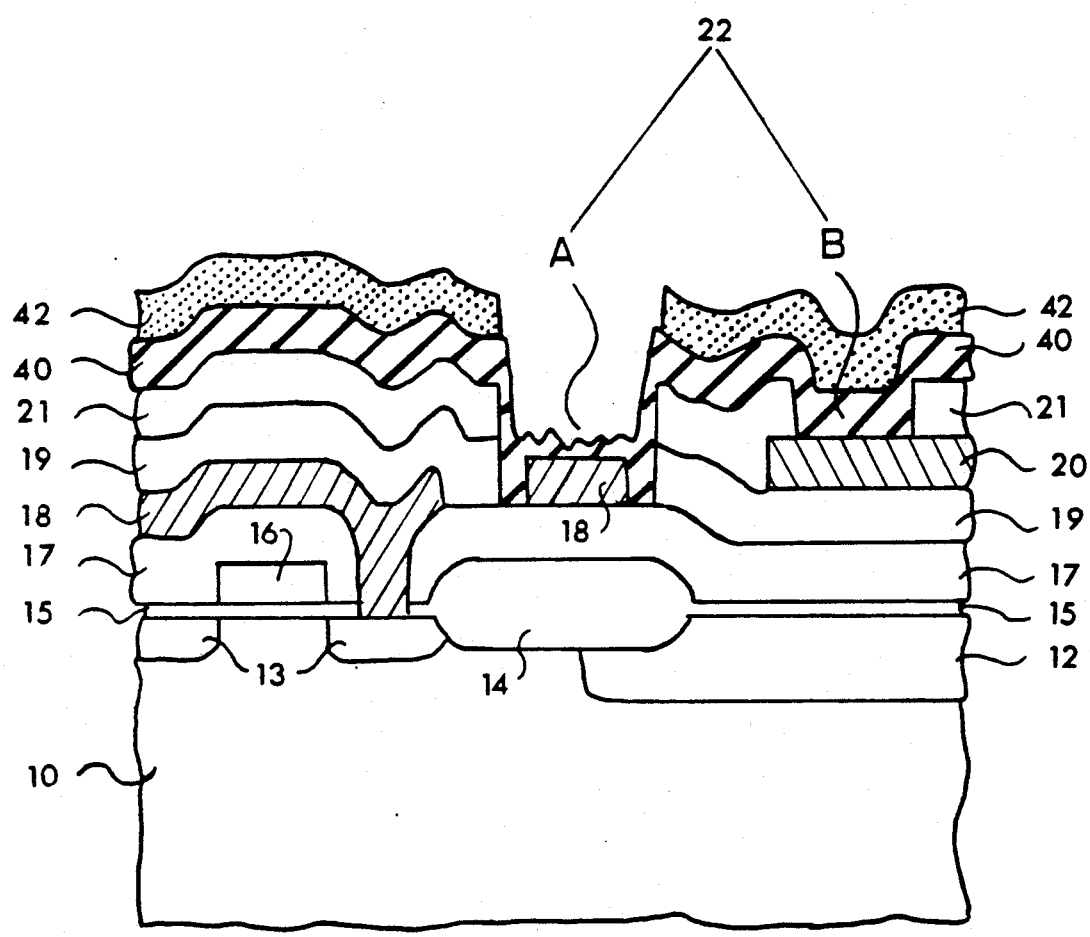
FIG. 4B is a cross-sectional illustration of the integrated circuit of 3B after laser removal of the laser absorbing layer and most of the etch-resistant coating from one of the above-selected apertures.

Upon application of laser radiation to selected locations such as location A, all of layer 42 and most of layer 40 is removed, as is seen in FIG. 4B. This would be usually effected by a Q-switched Nd+YAG laser at an energy density between 5 and 10 J/cm$^2$.

Following application of laser radiation, a dry etch step may take place, employing, for example an RIE etcher such as Plasma Term System 72, commercially available from Plasma Therm Inc. of the U.S.A., with a CF$_4$ gas at a plasma RF power of 200W, for a period of 60–120 seconds. This step is effective to completely clean the layer 40 at the selected locations, such as location A, while leaving sufficient thickness of the etch resistant layer to ensure etch resistance at non selected locations. The result of application of this step is seen in FIG. 4D.

Figure 5B:
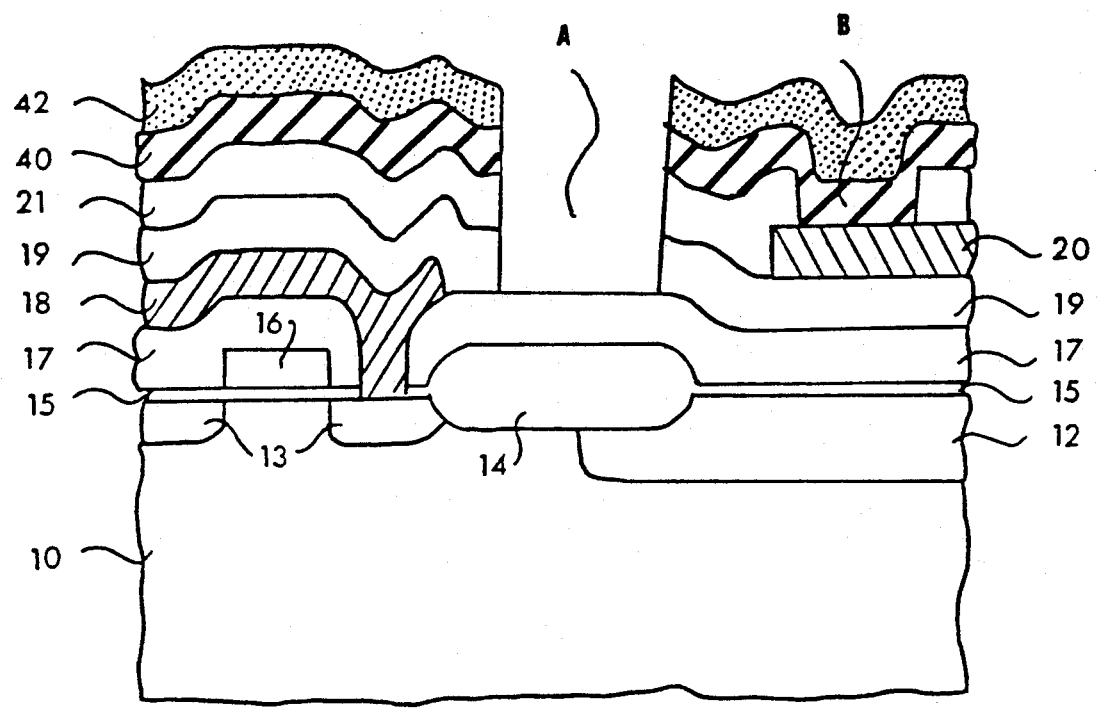
FIG. 5B is a cross-sectional illustration of the integrated circuit of FIG. 4D after dry etching of the metal underlying the removed etch resistant coating.

Thereafter a conventional metal etch step may take place for disconnecting the metal links at the selected locations. The result of this step is shown in FIG. 5B.

Following the metal etching step, the layers 40 and 42 may be completely removed from all locations to enable subsequent probing and bonding of the integrated circuit. The result of this step is shown in FIG. 6.

Figure 3C:
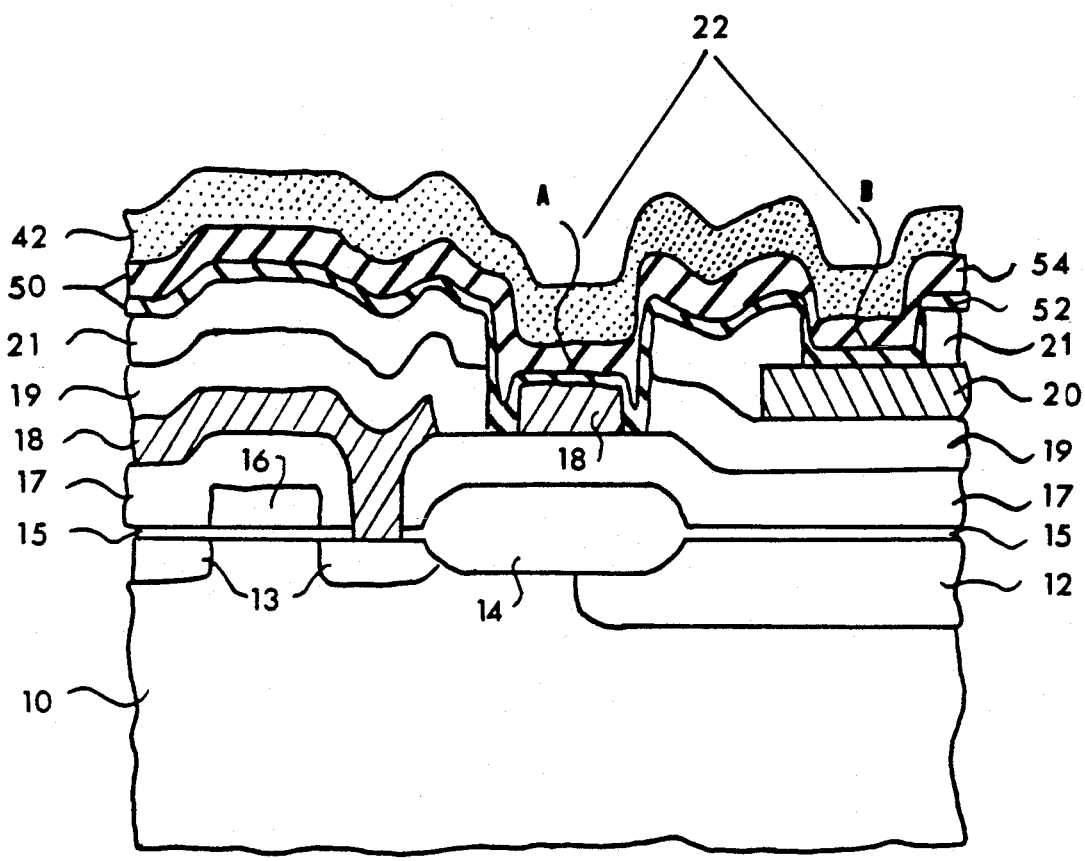
FIG. 3C is a cross-sectional illustration of the integrated circuit of FIG. 2 coated with a three layer etch-resistant coating.

Reference is now made to FIG. 3C, which is a cross-sectional illustration of the integrated circuit of FIG. 2 coated with a three layer etch-resistant coating.

According to an alternative to the embodiment of the invention described above and illustrated in FIG. 3B, in FIG. 3C there is shown an arrangement wherein the etch resistant coating includes a two-layered insulation layer, indicated by reference numeral 50, including a lower layer 52 of silicon oxide (SiO$_2$) and an upper layer 54 of silicon nitride (Si$_3$N$_4$). The remainder of the integrated circuit may be identical to that shown in FIG. 3B. Layer 52 may have a typical thickness of between 1000 and 4000 angstrom and layer 54 may have a typical thickness of between 3000 and 10,000 angstrom.

This arrangement provides a convenient etch stop between layers 54 and 52 and between layers 52 and 21 which is useful during the removal of etch resistant layers 42 and 50.

Figure 4C:
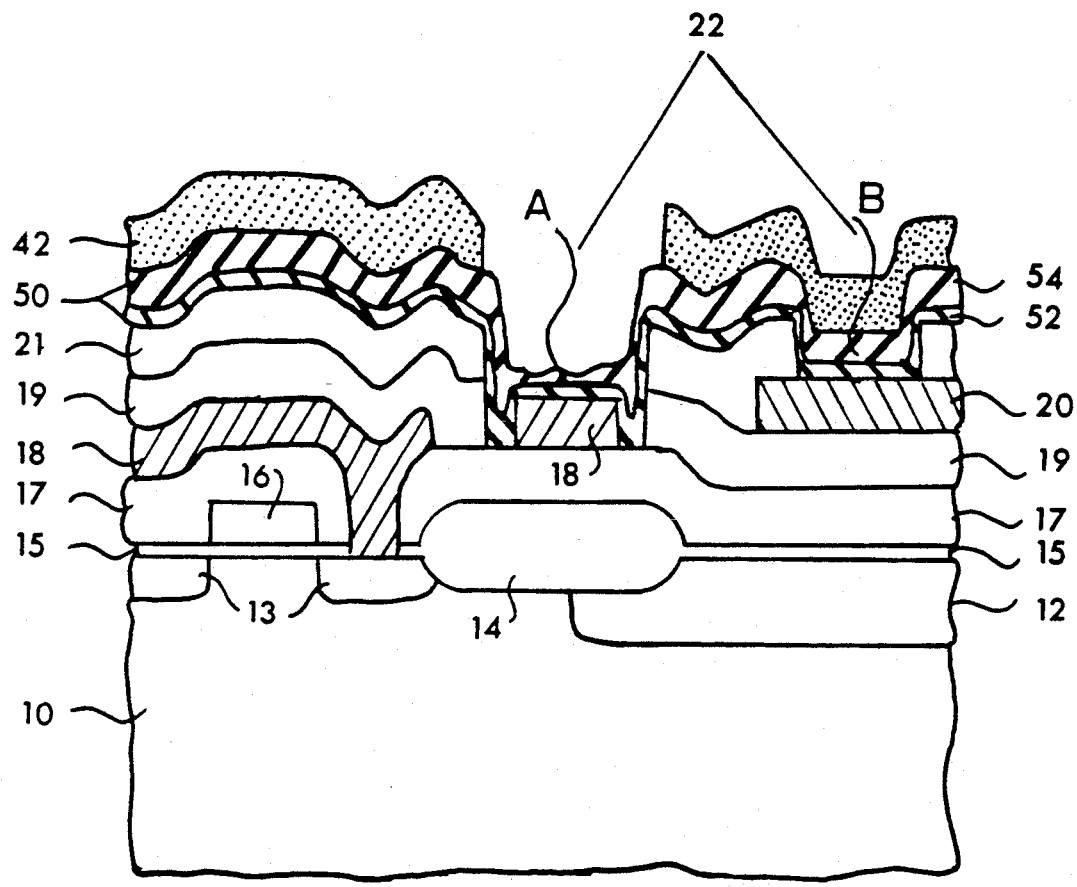
FIG. 4C is a cross-sectional illustration of the integrated circuit of FIG. 3C after laser removal of the laser absorbing layer and most of the middle layer of the etch-resistant coating.
Figure 4D:
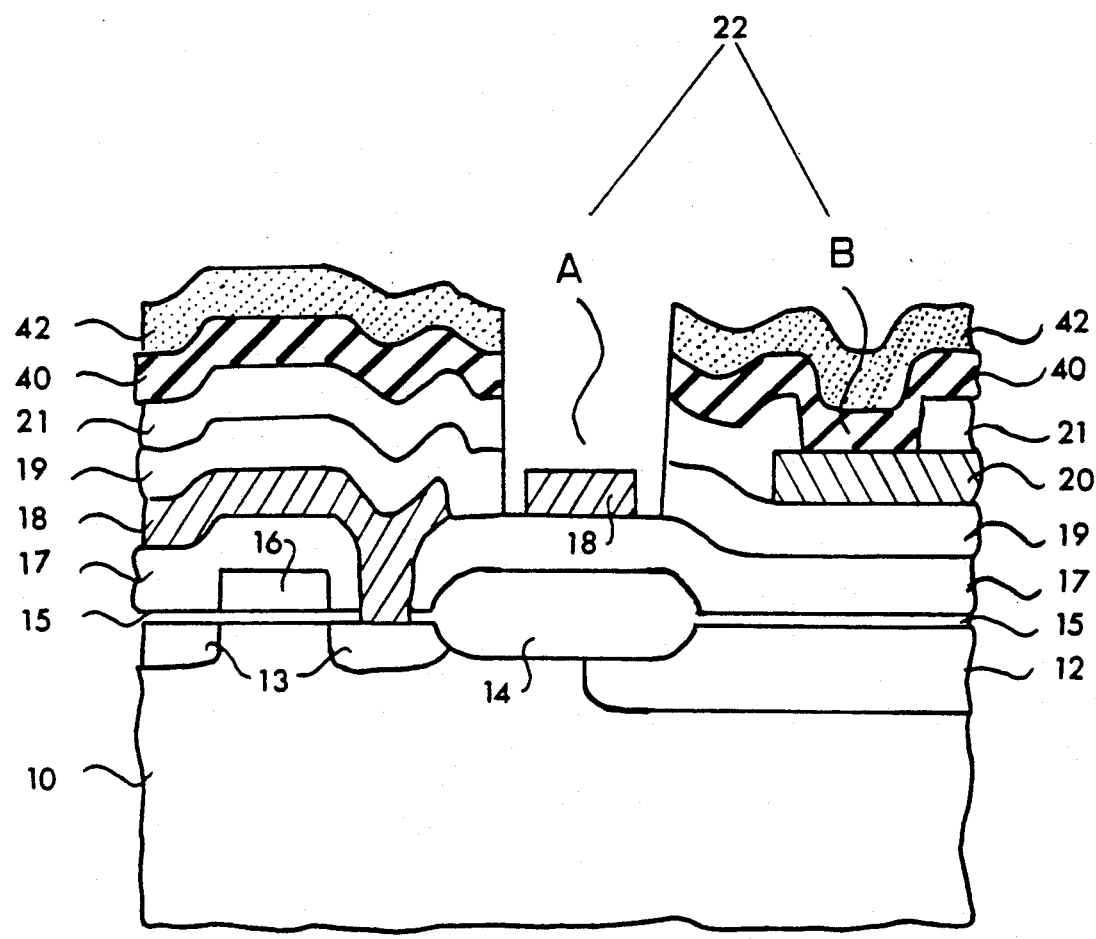
FIG. 4D is a cross-sectional illustration of the integrated circuit of FIG. 4B after dry etching of the etch-resistant layer.

FIG. 4C shows the structure of FIG. 3C after the application of laser radiation to selected locations such as 22A.

Figure 4E:
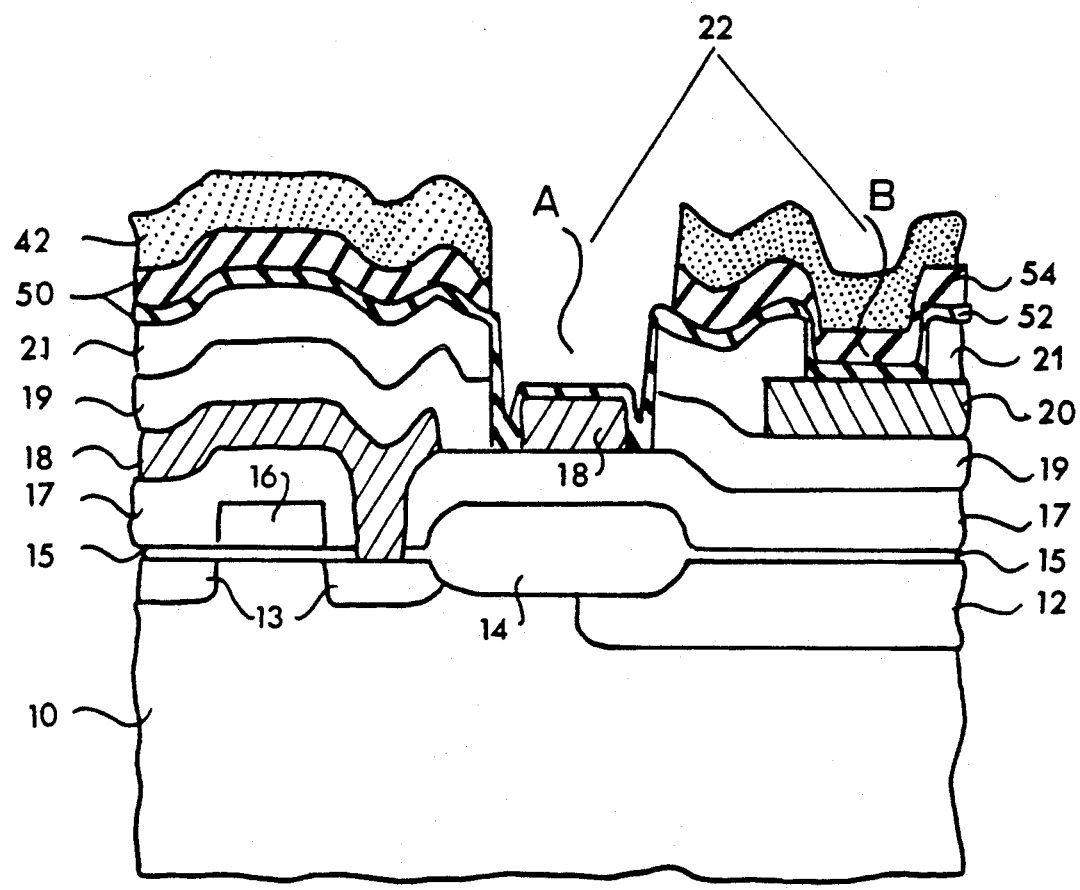
FIG. 4E is a cross-sectional illustration of the integrated circuit of FIG. 4C after selective etching of the middle layer of the etch-resistant coating.
Figure 4F:
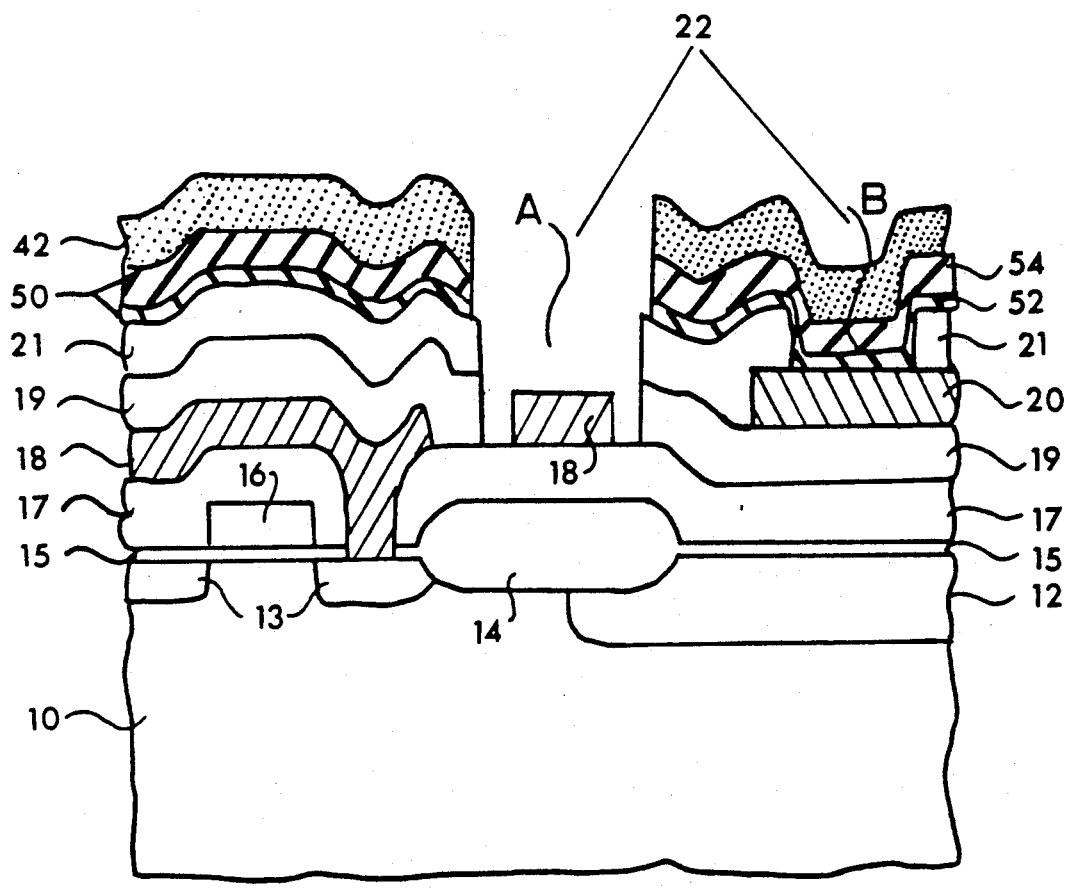
FIG. 4F is a cross-sectional illustration of the integrated circuit of FIG. 4E after selective etching of the bottom layer of the etch-resistant coating.
Figure 5C:
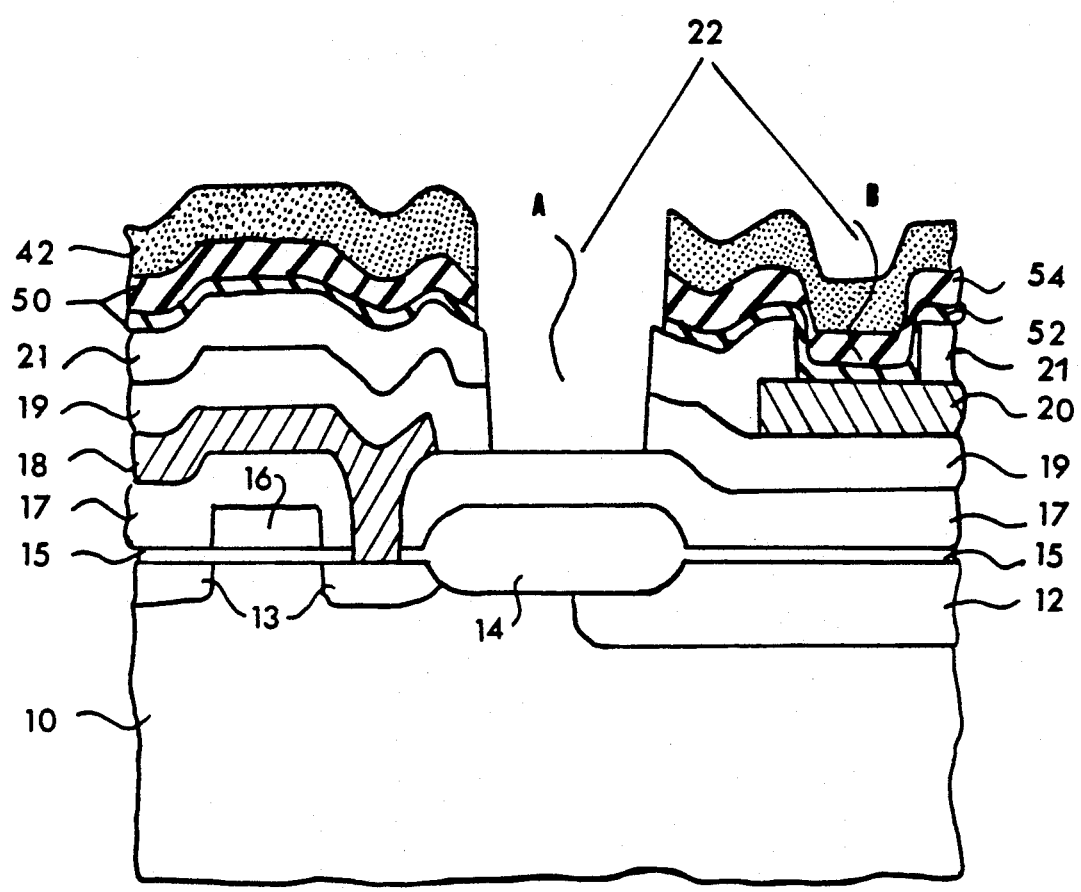
FIG. 5C is a cross-sectional illustration of the integrated circuit of FIG. 4F after dry etching of the metal underlying the removed etch-resistant coating and FIG. 6 is a cross-sectional illustration of the integrated circuit of FIGS. 4A, 4B, and 4C after metal etching and removal of the etch resistant coating.

Following application of laser radiation, selective etching of layer 54 removes the residue of this layer at location 22A, as shown in FIG. 4E. Further selective etching of layer 52 removes the bottom layer at location 22A, as shown in FIG. 4F. The underlying metal can then be removed as shown in FIG. 5C.

Figure 3D:
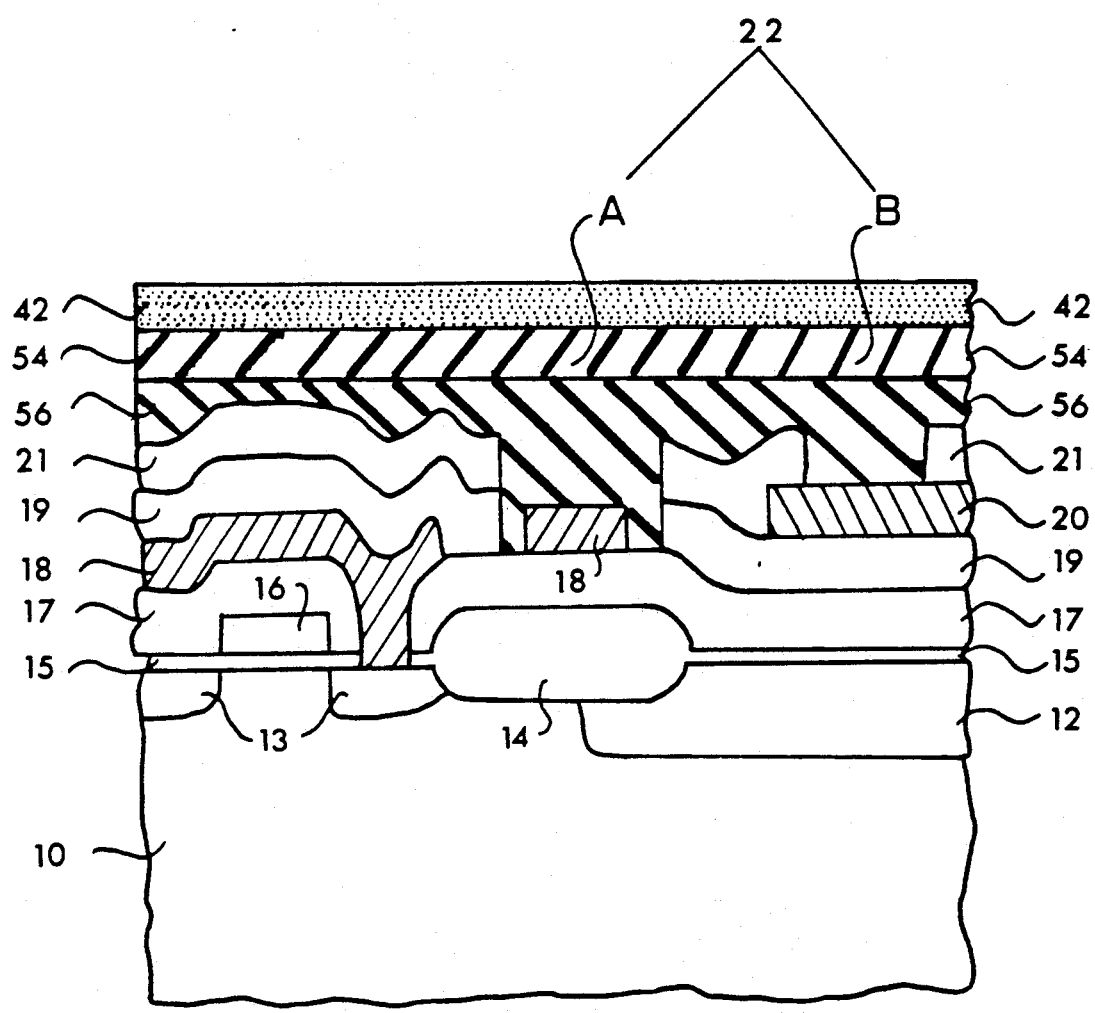
FIG. 3D is a cross-sectional illustration of the integrated circuit of FIG. 2 coated with a three-layer etch resistant coating wherein the lower layer is a planarization layer.

Reference is now made to FIG. 3D which is a cross-sectional illustration of the integrated circuit of FIG. 2, coated with a three layer etch resistant coating, wherein the bottom layer of the coating is a planarization layer.

In accordance with the alternative embodiment illustrated in FIG. 3D, the bottom layer, indicated by reference numeral 56, may be a planarization layer composed of polyimide, probimide, spin-on glass or similar dielectric coating. The remainder of the integrated circuit may be identical to that shown in FIG. 3C. The planarization layer 56 may have a thickness preferably between 0.5 and 2 micron.

Figure 4G:
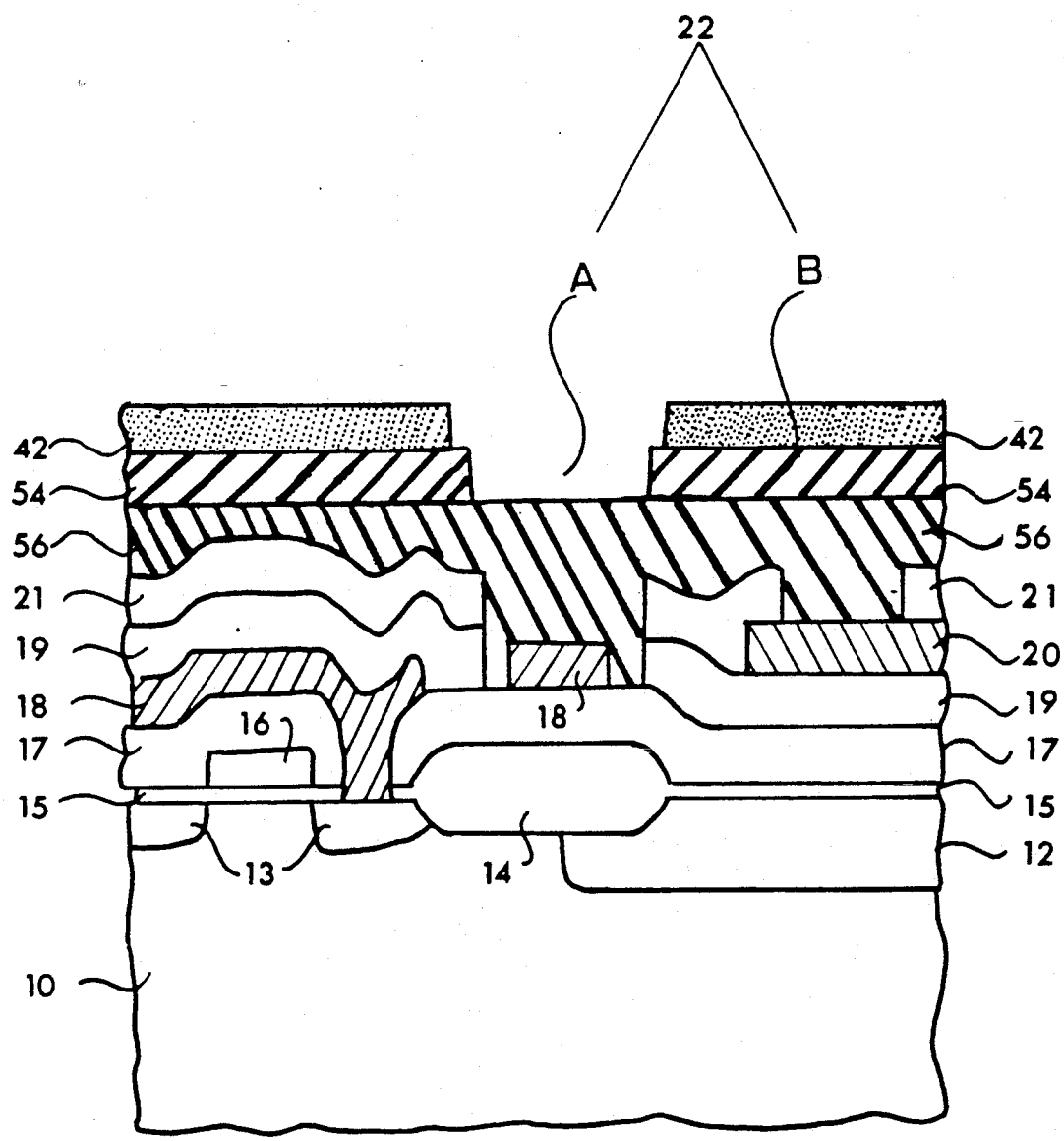
FIG. 4G is a cross-sectional illustration of the integrated circuit of FIG. 3D after laser removal of the laser absorbing layer and the middle etch resistant layer.
Figure 4H:
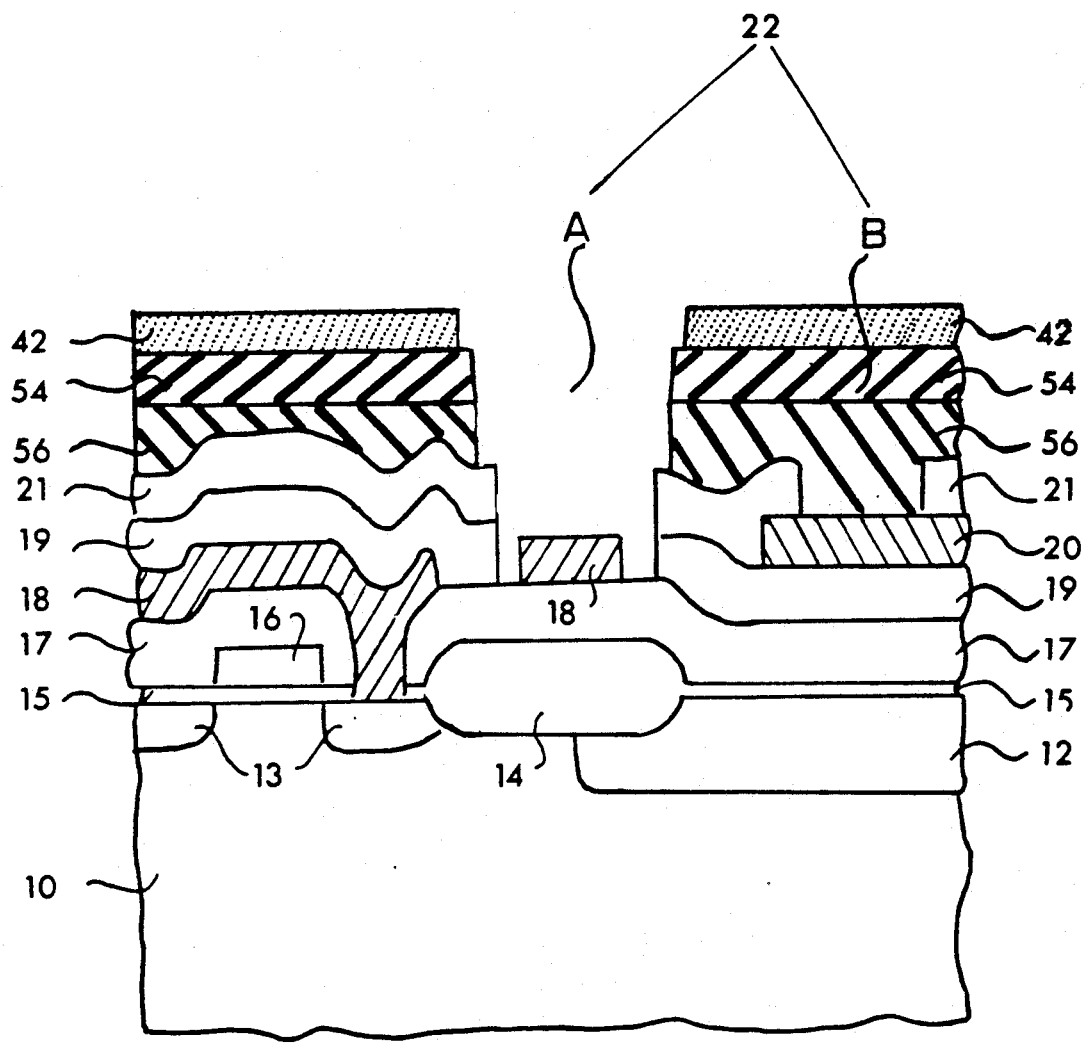
FIG. 4H is a cross-sectional illustration of the integrated circuit of FIG. 4G after etching of the planarization layer.

This arrangement provides a convenient etch stop between layers 56 and 21 and, additionally, it allows uniform laser ablation of the etch resistant coating over different metal levels such as 18 and 20 at locations 22A and 22B, respectively, of FIG. 2. FIGS. 4G and 4H show the corresponding steps of laser removal of the upper two layers of the etch resistant coating and the etching of the planarization layer 56, respectively, at selected locations such as 22A. This is followed by removal of the metal layer as shown in FIG. 5C.

It is appreciated that in accordance with an alternative embodiment of the invention, the apertures 22, such as at locations A and B, need not be formed or may extend only partially through the respective insulative layers. In such a case, the insulative layers 40 or 50 may be eliminated and the laser-absorbing layer is coated directly over layer 21. In this case the laser energies applied should be adjusted to take into account the differences in thickness of the insulative layers. It is further noted that the elimination of apertures 22 may alternatively exist only over metal II and not over metal I.

It will be appreciated by persons skilled in the art that the present invention is not limited by what has been particularly shown and described hereinabove. Rather the scope of the present invention is defined only by the claims which follow:

We claim:
1. A semiconductor device comprising:
   a first patterned metal layer;
   an insulation layer formed over the first metal layer; and
   a second patterned metal layer formed over the insulation layer;
   said first and second patterned metal layers being formed with selectably removable regions;
   said insulation layer being formed with apertures overlying at least some of the selectively removable regions, and
   there being formed over the selectably removable regions an ablative triple layer coating comprising a layer of silicon oxide over which is formed a layer of silicon nitride and over which is formed a layer of amorphous silicon.
2. Apparatus according to claim 1 and wherein the silicon oxide layer has a thickness of between 1000 and 3000 angstrom.
3. Apparatus according to claim 1 and wherein the amorphous silicon layer contains up to 30% atomic weight of at least one of Hydrogen, Carbon, Nitrogen and Oxygen.
4. Apparatus according to claim 1 and wherein the silicon oxide layer contains up to 10% atomic weight of at least one of arsenic, phosphorous and boron.
5. A semiconductor device comprising:
   a first patterned metal layer;
   an insulated layer formed over the first metal layer; and
   a second patterned metal layer formed over the insulation layer;
   said first and second patterned metal layers being formed with selectably removable regions,
   said insulation layer being formed with apertures overlying at least some of the selectably removable regions, and
   there being formed over the selectably removable regions an ablative multi-layer coating comprising first and second dielectric layers having different etchability and thereover a layer of amorphous silicon.
6. Apparatus according to claim 5 and wherein at least one of said dielectric layers comprises silicon nitride.
7. Apparatus according to claim 5 and wherein the amorphous silicon layer contains up to 30% atomic weight of at least one of Hydrogen, Carbon, Nitrogen and Oxygen.
8. Apparatus according to claim 5 and wherein said apertures overlie removable regions on both said first and second metal layers.
9. Apparatus according to claim 5 and wherein said first dielectric layer comprises a planarization layer.
10. Apparatus according to claim 9 and wherein said planarization layer comprises a polymeric substance.
11. Apparatus according to claim 9 and wherein said planarization layer comprises a spin-on glass layer.
12. A semiconductor device comprising:
    a first patterned metal layer;
    an insulation layer formed over the first metal layer;
    a second patterned metal layer formed over the insulation layer;
    said first and second patterned metal layers being formed with selectably removable regions,
    said insulation layer being formed with apertures overlying at least some of the selectably removable regions, and
    there being formed over the selectably removable regions an ablative multi-layer dielectric coating comprising a dielectric layer and thereover a layer of laser energy absorbing material comprising amorphous silicon.
13. Apparatus according to claim 12 and wherein the amorphous silicon layer contains up to 30% atomic weight of at least one of Hydrogen, Carbon, Nitrogen and Oxygen.
14. A semiconductor device comprising:
    a first patterned metal layer;
    an insulation layer formed over the first metal layer; and
    a second patterned metal layer formed over the insulation layer;
    said first and second patterned metal layers being formed with selectably removable regions, and
    there being formed over the selectably removable regions an ablative multi-layer coating comprising a dielectric layer and thereover a layer of amorphous silicon.
15. Apparatus according to claim 14 and wherein said dielectric layer comprises silicon oxide, silicon nitride, or polyimide.
16. Apparatus according to claim 14 and wherein the amorphous silicon layer contains up to 30% atomic weight of at least one of Hydrogen, Carbon, Nitrogen and Oxygen.
17. Apparatus according to claim 16 and wherein said dielectric layer contains up to 10% atomic weight of at least one of arsenic, phosphorous and boron.

* * * * *